(12) United States Patent
Kishino et al.

(10) Patent No.: US 7,899,104 B2
(45) Date of Patent: Mar. 1, 2011

(54) EL SEMICONDUCTOR DEVICE

(75) Inventors: Katsumi Kishino, Tokyo (JP); Ichiro Nomura, Tokyo (JP); Tsunenori Asatsuma, Kanagawa (JP); Kunihiko Tasai, Kanagawa (JP); Koshi Tamamura, Tokyo (JP); Hiroshi Nakajima, Kanagawa (JP); Hitoshi Nakamura, Hachioji (JP); Sumiko Fujisaki, Hachioji (JP); Takeshi Kikawa, Kodaira (JP)

(73) Assignees: Hitachi, Ltd., Tokyo (JP); Sophia School Corporation, Tokyo (JP); Sony Corporation, Tokyo (JP)

( * ) Notice: Subject to any disclaimer, the term of this patent is extended or adjusted under 35 U.S.C. 154(b) by 149 days.

(21) Appl. No.: 12/038,062

(22) Filed: Feb. 27, 2008

(65) Prior Publication Data

US 2009/0059985 A1 Mar. 5, 2009

(30) Foreign Application Priority Data

Aug. 31, 2007 (JP) .............................. 2007-225724

(51) Int. Cl.
*H01S 5/00* (2006.01)
(52) U.S. Cl. ............................... 372/45.012; 372/43.01
(58) Field of Classification Search ............. 372/45.012
See application file for complete search history.

(56) References Cited

U.S. PATENT DOCUMENTS 3,413,507 A * 11/1968 Sato et al. ................... 313/499

2007/0051937 A1 * 3/2007 Kishino et al. ................ 257/13

FOREIGN PATENT DOCUMENTS

| JP | 2007-073606 | 3/2007 |
| JP | 2007-251092 | 9/2007 |

OTHER PUBLICATIONS

E. Kato at al., "Significant progress in II-VI blue-green laser diode lifetime", Electronics Lett., 34, (1998), p. 282.
N. Dai et al., "Molecular beam epitaxial growth of high quality $Zn_{1-x}Cd_xSe$ on InP substrates", Appl. Phys. Lett., 66, (1995), p. 2742.
T. Morita et al., "Molecular beam epitaxial growth of MgZnCdSe on (100) InP substrates", J. Electron. Mater., 25, (1996) p. 425.

* cited by examiner

*Primary Examiner* — Armando Rodriguez
(74) *Attorney, Agent, or Firm* — Antonelli, Terry, Stout & Kraus, LLP.

(57) ABSTRACT

An n-type cladding layer structure which has good luminescence properties without the use of substances corresponding to RoHS Directive and a high Cl-doping efficiency, i.e. which facilitates the manufacture of a semiconductor optical element and device with low crystal defects and high reliability, and an active layer and a p-type cladding layer therefor are provided. The n-type layer being lattice matched to an InP substrate and containing Group II-VI compound as a main ingredient is a Group II-VI compound semiconductor, in which the Group II elements consist of Mg, Zn, and Be and the Group VI elements consist of Se and Te. The n-type layer of the present invention is characterized by a large energy gap, high energy of the bottom of a conduction band that is effective for suppressing the Type II luminescence, high carrier concentration, and low crystal defects attributed to a good quality crystallinity.

3 Claims, 12 Drawing Sheets n-CLAD LAYER
① MgZnSeTe
② MgSe/MgZnSeTe SL

ACTIVE LAYER
③ BeZnSeTe
④ MgSe/BeZnSeTe SL
⑤ ZnSe/BeZnTe SL p-CLAD LAYER
⑥ BeMgZnTe
⑦ BeZnTe/MgBeTe SL
⑧ BeZnTe/MgSe SL

FIG.2

| INGREDIENT NAME | a(Å) | Eg(eV) |
|---|---|---|
| InP | 5.8687 | |
| ZnTe | 6.10 | 2.26 |
| BeTe | 5.62 | 4.10 |
| MgTe | 6.35 | 3.50 |
| MgSe | 5.91 | 4.00 |
| CdTe | 6.48 | 1.44 |
| CdSe | 6.05 | 1.69 |
| ZnSe | 5.67 | 2.67 |

BOWING PARAMETER : Cd − Zn = 0.26
ZnSe − Te = 1.621
CdSe − Te = 1.621

FIG.3

| Eg(eV) | x[*] | y[*] |
|---|---|---|
| 2.8 | 0.56 | 0.85 |
| 2.9 | 0.61 | 0.88 |
| 3.0 | 0.65 | 0.90 |
| 3.1 | 0.68 | 0.92 |

[*] $Mg_x Zn_{1-x} Se_y Te_{1-y}$ TO BE LATTICE-MATCHED TO InP SUBSTRATE (*) $Be_xZn_{1-x}Se_yTe_{1-y}$ TO BE LATTICE-MATCHED TO InP SUBSTRATE (*) $Be_x Mg_y Zn_{1-x-y} Te$ TO BE LATTICE-MATCHED TO InP SUBSTRATE

| |
|---|
| 36 ; ZnTe |
| 35 ; MgZnSeTe : Cl |
| 34 ; ZnCdSe : Cl |
| 33 ; InGaAs : Si |
| 32 ; InP : Si |
| 31 ; InP : S sub. |

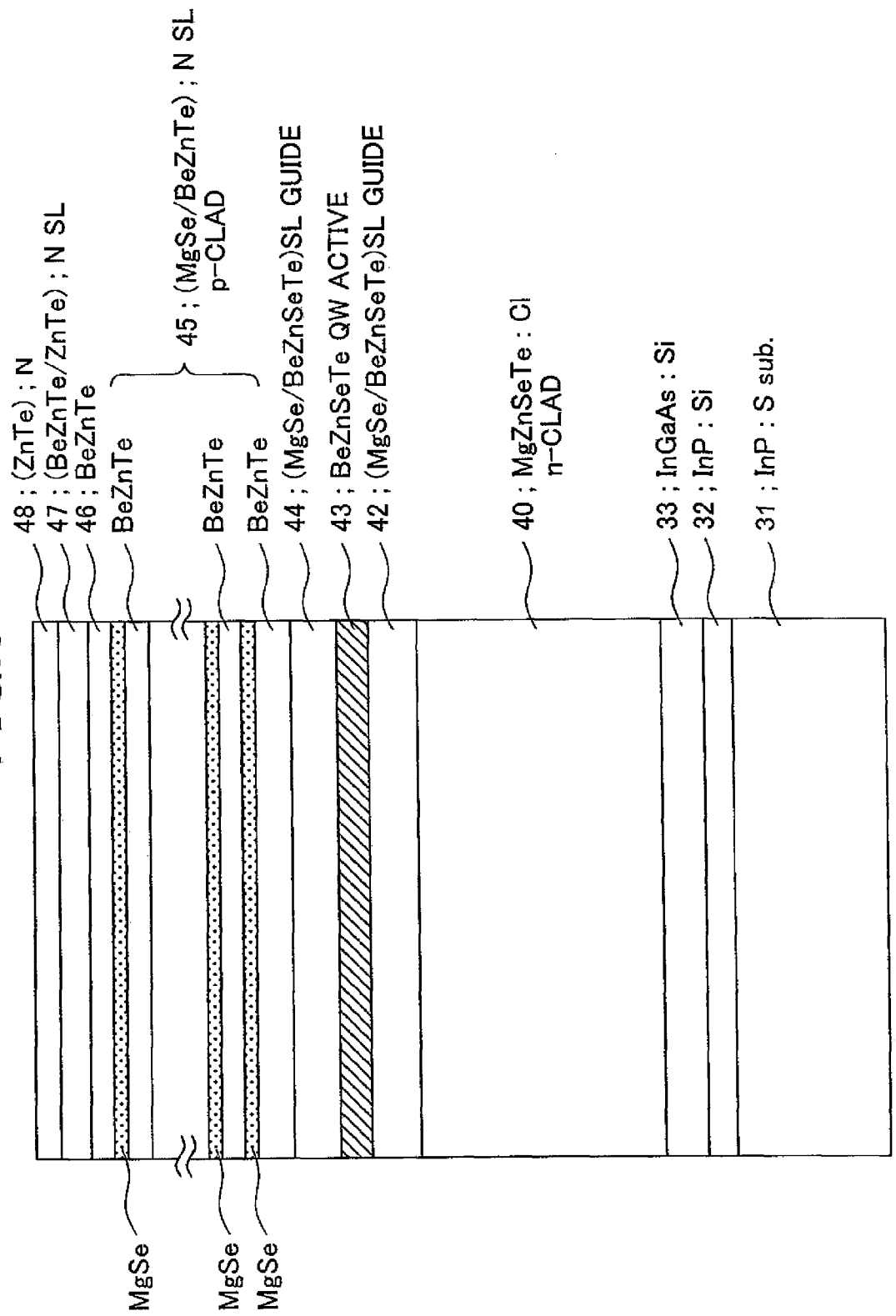

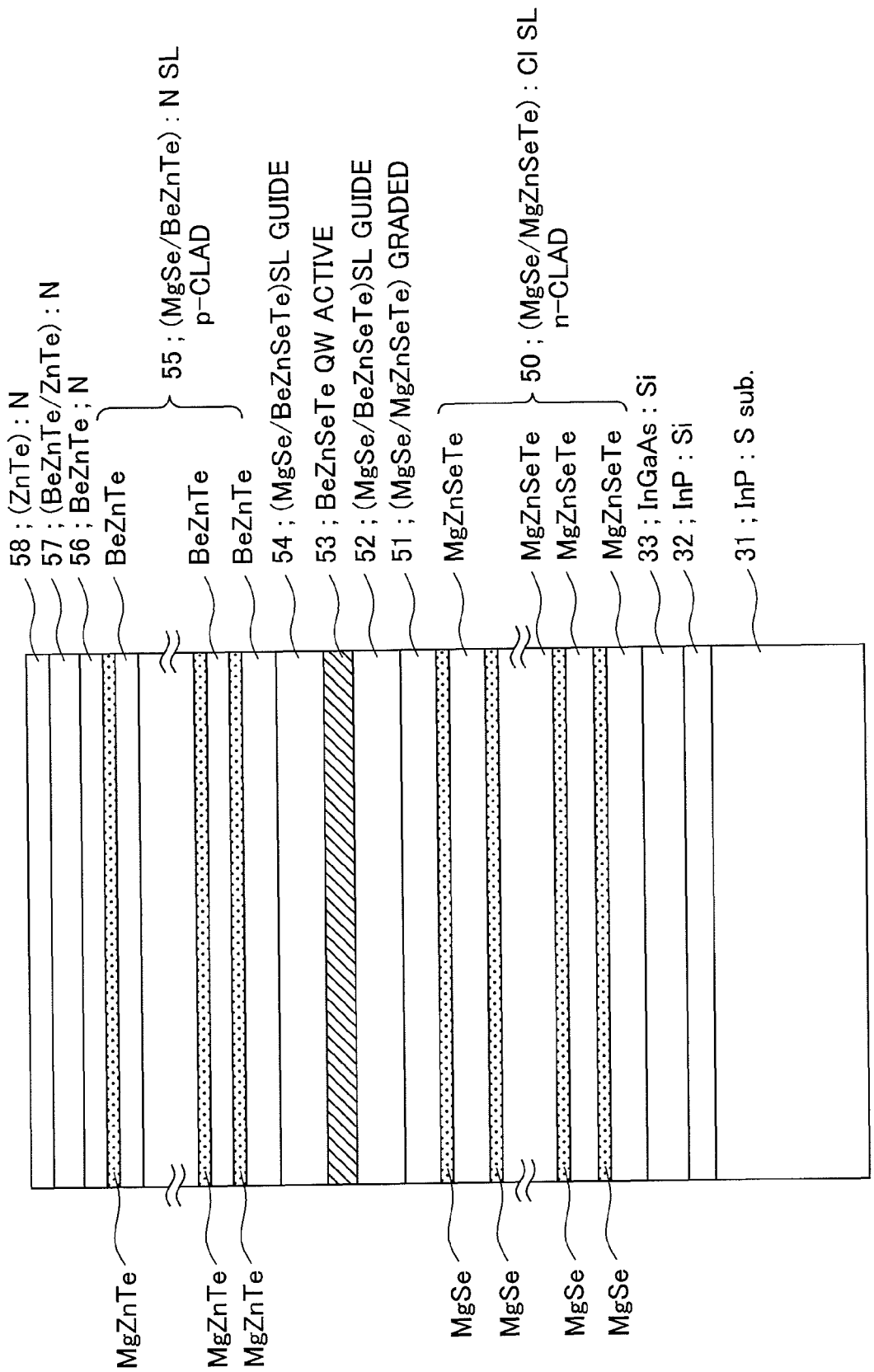

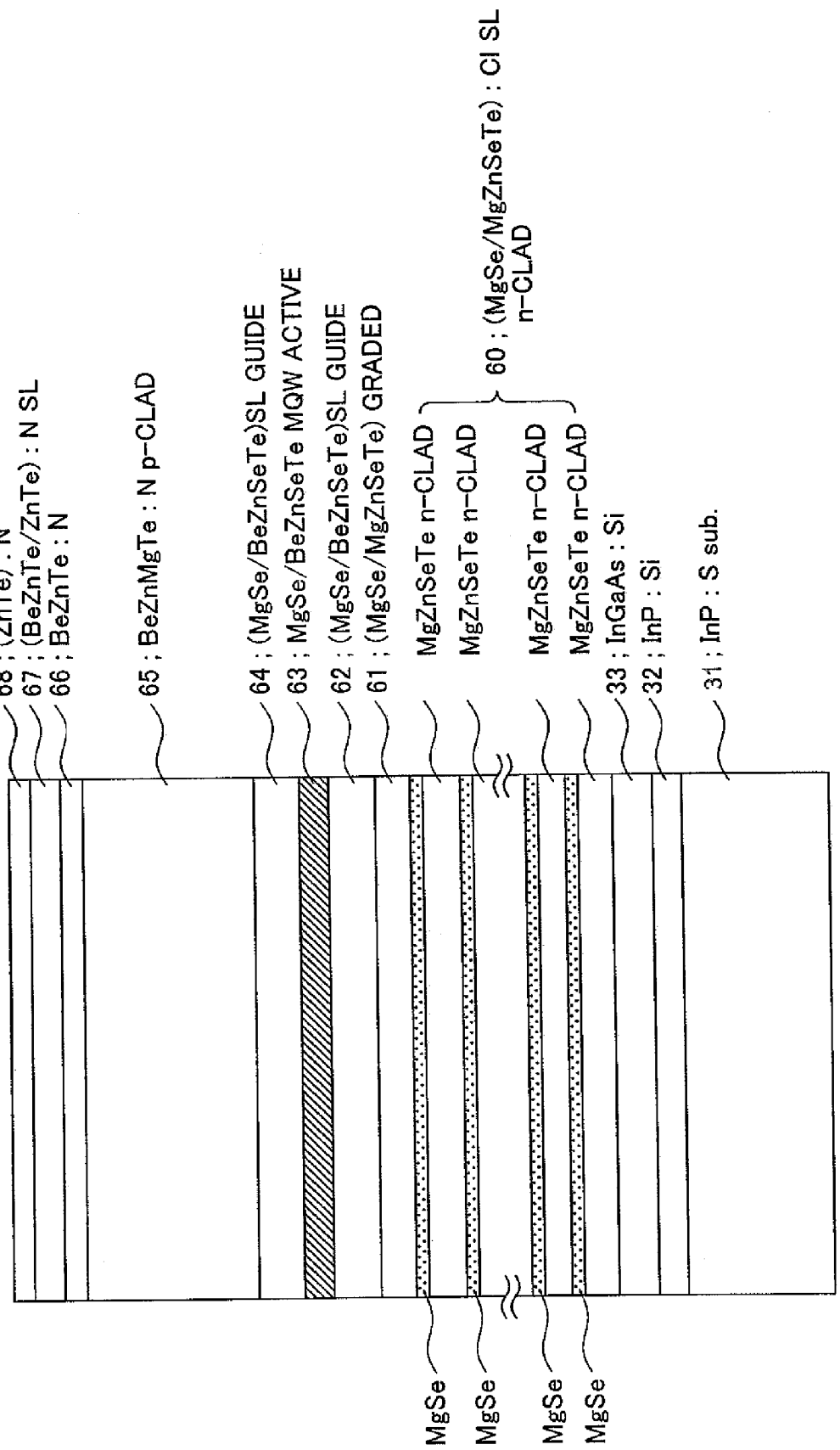

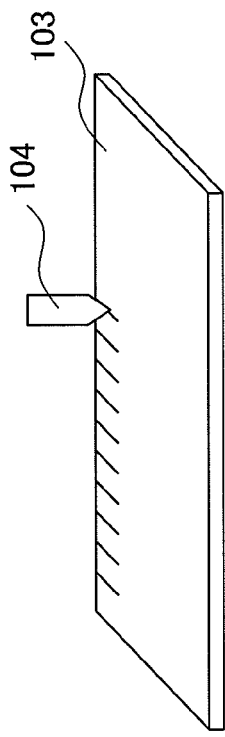
FIG.12C
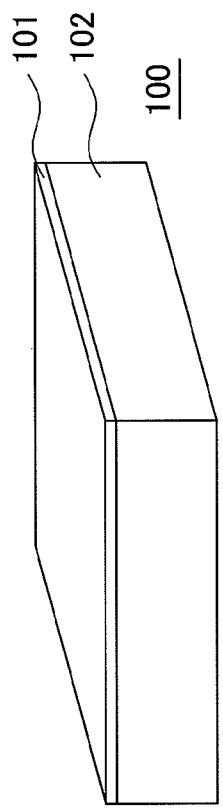
FIG.12A
FIG.12B
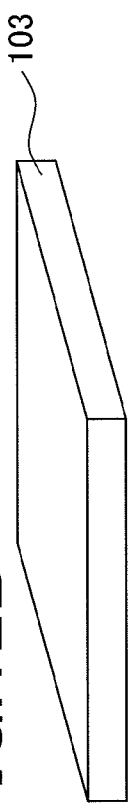
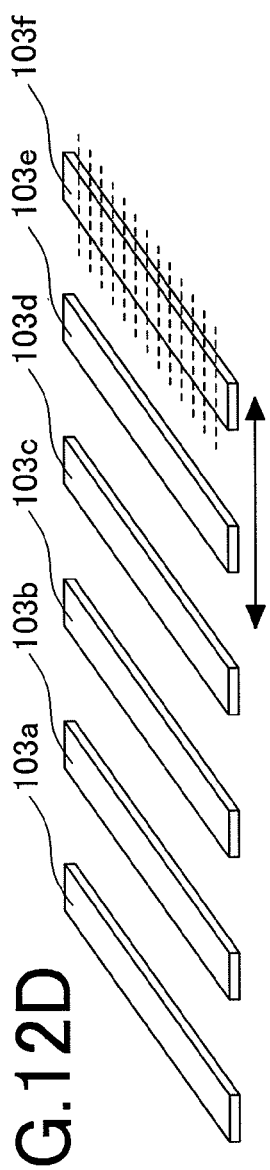
FIG.12D
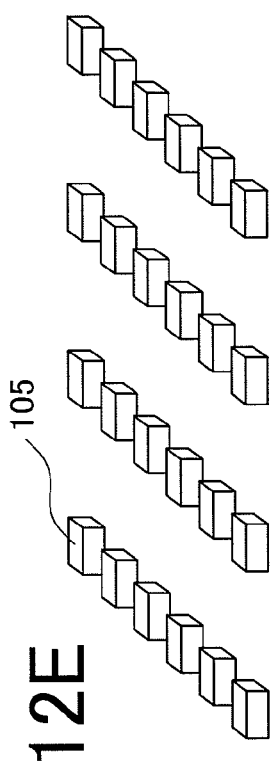
FIG.12E

EL SEMICONDUCTOR DEVICE

CLAIM OF PRIORITY

The present application claims priority from Japanese application JP2007-225724, filed on Aug. 31, 2007, the content of which is hereby incorporated by reference into this application.

BACKGROUND OF THE INVENTION

1. Field of the Invention

The present invention relates to an EL semiconductor device having an n-type semiconductor layer structure on an InP substrate; and, more particularly, to an EL semiconductor device, e.g., a green light emitting laser, featuring a sufficient energy gap and carrier concentration, including an n-type cladding layer made out of II and VI group elements and capable of trapping and confining light and carriers.

2. Background of the Related Arts

An EL semiconductor device, e.g., a semiconductor laser diode (LD), is a light source used for recording or reproducing data onto or from an optical disc. Historically, most of the research has been focused on development of a light source with a shorter wavelength to be able to make higher recording densities in CDs, DVDs, or Blu-ray discs.

Besides some use in optical discs, LD of 1.55 μm, 1.3 μm, and 0.98 μm operating wavelengths for use in communications has been developed. In effect, its application range is gradually being expanded to other fields such as a solid laser excitation unit, processing, sensor, measuring instrument, medical treatment, display, etc. While a red LED has been put to practical use, blue and green-emitting superluminescent diodes have not yet been developed for years. In the meantime, a new AlGaInN-based device was developed and has been put to practical use, and later researches have continually progressed to ultraviolet or white as its application. In result, LED became an essential element in people's lives nowadays and is implemented in a broader application range than LD, not only for indicators but also for displays and illumination.

In case of green color having the highest visibility for human eye, a green LED is still low in efficiency compared with other color LEDs and no one has yet discovered a high efficiency LD in a visible ray having a wavelength within the range from about 480 nm (pure blue) to about 600 nm (orange). Therefore, if a green LD, green being one of three primary colors, can be developed, it certainly will open new application fields.

As for semiconductor materials for those optical devices, AlGa(In)As based materials were used for infrared devices with a wavelength of a 780 nm, 808 nm, 860 nm, 915 nm, or 980 nm band, and InGaAsP based Group III-V compounds were used for devices with a wavelength of 1.3 μm or 1.55 μm. In addition, with technical advances in researches, AlGaInP based Group III-V compound semiconductors and AlGaInN based Group III-V nitride semiconductors were developed and are now put to practical use for red light emitting devices with a wavelength of a 600 nm band (635-670 nm to be specific) and blue light emitting devices with a wavelength of a 400 nm band (350-480 nm to be specific), respectively.

For an unexplored region around 480-600 nm related to the technical field of the present invention, III-V group compound semiconductors as well as II-VI group semiconductors are leading candidates, and a cyan-blue LD around 500 nm has actually been reported to have an about 400-hour average lifetime under the conditions of room temperature and continuous wave lasing at 1 mW (E. Kato at al. "Electronics Lett.", 34, (1998), p. 282). However, II-VI group semiconductors include Hg or Cd for example, which are strongly toxic substances to a human body. As a matter of fact, except for special cases, it is very hard to use these two substances as a product.

The European Union (EU) RoHS Directive was adopted in Jan. 27, 2003 (Official Gazette dated February 13) and came into force on 1 Jul. 2006, imposing the Restriction of the use of certain Hazardous Substances (RoHS) by which all electrical and electronic equipment manufacturers were banned from using 6 kinds of substances such as Pb, Hg, Cd, heavy metals with hexavalent chromium, and Brominated Flame Retardants (BFR) (polybromo diphenyl ether (PBDE) and polybromo biphenyl (PBB)) in their products by Jul. 1, 2006. Similarly, J-Moss (Japanese Ministerial Ordinances) was imposed which requires the same by Jul. 1, 2006.

Although details on the legislation are not provided here, it would be sufficient to mention that there were 17 examples of application restrictions and maximum allowances of the RoHS substances. Starting with manufactures playing a key role in the environmental activities for society, there were many who announced a complete stop of using those 6 kinds of RoHS substances, so it was pretty much impossible to apply those restricted substances to new products.

The inventors and several research groups in or outside of Japan noticed $Mg_xZn_yCd_{1-x-y}Se$ Group II-VI compound semiconductors that can be manufactured via crystal growth and lattice-matched to an InP semiconductor substrate as one of material candidates for forming a semiconductor device generating yellow or green, and continued researches from there (refer to N. Dai et al., "Appl. Phys. Lett." 66, (1995), p. 2742 and T. Morita et al., "J. Electron. Mater." 25, (1996) p. 425). It is known that $Mg_xZn_yCd_{1-x-y}Se$ can be lattice matched to InP if each composition (x, y) satisfies a relation of y=0.47−0.37x (x=0 to 0.8, y=0.47 to 0.17), and a forbidden band thereof can be controlled from 2.1 eV up to 3.6 eV by changing its composition from (x=0, y=0.47) to (x=0.8, y=0.17).

The above-described composition range give energy gaps of the direct transition type, and those energy gaps correspond to wavelengths between 590 nm (Mars yellow, orange color) and 344 nm (ultraviolet). This indicates that active and cladding layers to form a double hetero structure, which is the basic structure of a yellow or green light emitting semiconductor device, can be realized simply by changing the composition of $Mg_xZn_yCd_{1-x-y}Se$.

In fact, photoluminescence measurements of the $Mg_xZn_yCd_{1-x-y}Se$ grown on an InP substrate by Molecular Beam Epitaxy (MBE) give good luminescence properties with a peak wavelength in a range from 571 nm to 397 nm for $Mg_xZn_yCd_{1-x-y}Se$ with a different composition (T. Morita et al., "J. Electron. Mater." 25, 425 (1996)).

Also, there was a report that laser oscillation by photo-excitation was observed in each of red, green and blue bands of an $Mg_xZn_yCd_{1-x-y}Se$ laser structure (L. Zeng et al., "Appl. Phys. Lett." 72, 3136 (1998)).

Meanwhile, there has been no report so far on laser oscillation by current driving in a semiconductor laser diode that is formed of $Mg_xZn_yCd_{1-x-y}Se$ only. The main reason for the absence of laser oscillation is because it is difficult to control p-type conductivity by impurity doping of $Mg_xZn_yCd_{1-x-y}Se$.

Therefore, with an n-type $Mg_xZn_yCd_{1-x-y}Se$ cladding layer, we found ideal materials for an active layer, p-cladding layer, guide layer, contact layer and the like to prepare a test.

For instance, we used MgZnCdSe for an n-cladding layer, ZnCdSe for an active layer, and MgSe/BeZnTe for a p-cladding layer, and succeeded to obtain a 560 nm yellow-green LD's oscillation at 77K. Further, using BeZnSeTe for an active layer, we observed a single peak producing Mars yellow (orange color) or yellowish green at 594 nm, 575 nm, and 542 nm. It turned out that a 575 nm LED lasts longer than 5000 hours at room temperature.

Particularly, a close examination on light emission mechanism in an LED including an n-cladding layer that is formed of $Mg_xZn_yCd_{1-x-y}Se$ or MgSe/ZnCdSe superlattice structure and a BeZnSeTe active layer indicated emission wavelength is substantially influenced by driving current, and the type II luminescence can be observed at the hetero-interface in the vicinity of the n-cladding layer and the active layer.

SUMMARY OF THE INVENTION

Although inventors have used a Cl-doped MgZnCdSe or Cl-doped MgSe/Cl-doped ZnCdSe superlattice layer as a stable n-cladding layer, in some cases where it is difficult to use Cd for a product it is necessary to manufacture a stable n-cladding layer without Cd.

It is also a primary object of the present invention to provide an optimum n-cladding layer that does not contain any of the forbidden or restricted substances, and has good luminescence properties and a high Cl doping efficiency, i.e. a low crystal defect. In this way, a semiconductor optical device having a long life can easily be manufactured.

Moreover, to suppress the Type II emission, it is required to form the lowest bottom of a conduction band in a semiconductor band structure to be higher at an n-cladding layer than that at a BeZnSeTe active layer.

The inventors made a close study on this matter to achieve the above-described object. To briefly explain, the inventors tried to find a material of a cladding layer for Group II-VI compound semiconductors, which was Cd-free and could be lattice matched to InP. This involved a further study and evaluation on crystal growth and optical/electrical properties of the material, assuming that the cladding layer made out of the material must have an energy gap and a refractive index to be able to trap and confine light and carriers, and can be doped as an n-type layer to a sufficient carrier concentration.

As a result, we learned that an n-cladding having MgZnSeTe as a main element satisfied all the requirement mentioned above, and discovered an active layer material (BeZnSeTe, etc) suitable for the n-cladding and a p-cladding material (BeMgZnTe, etc.) to suggest a semiconductor layer structure that can cause green oscillation. By incorporating such a semiconductor layer into the manufacture of a semiconductor device, the inventors expect this would contribute greatly to the realization of optical elements and optical devices such as a yellow or green laser diode.

An advantageous embodiment of the present invention provides an n-cladding layer that can be formed on an InP substrate and is suitable for optical devices such as a laser diode containing Group II-VI compound semiconductor as a main material, light emitting diode, light receiving device, etc. In relation to this, the present invention provides a method of manufacturing a semiconductor optical device to facilitate the fabrication of a semiconductor light emitting/receiving device that features excellent luminescence properties and high reliability.

BRIEF DESCRIPTION OF THE DRAWINGS

FIG. 2 shows lattice parameters and energy gap values of Group II-V binary compound semiconductor as related to the present invention;

FIG. 3 shows MgZnSeTe lattice matched to an InP substrate calculated by a preferred embodiment of the present invention;

FIG. 9 is an explanatory view of a semiconductor laser structure according to an embodiment of the present invention;

FIG. 10 is another explanatory view of a semiconductor laser structure according to an embodiment of the present invention;

FIG. 11 is still another explanatory view of a semiconductor laser structure according to an embodiment of the present invention;

FIGS. 12A through 12E are diagrams explaining the first half portion of a conventional mechanism to form an individual EL semiconductor device.

DETAILED DESCRIPTION OF THE PREFERRED EMBODIMENT

Figure 1:
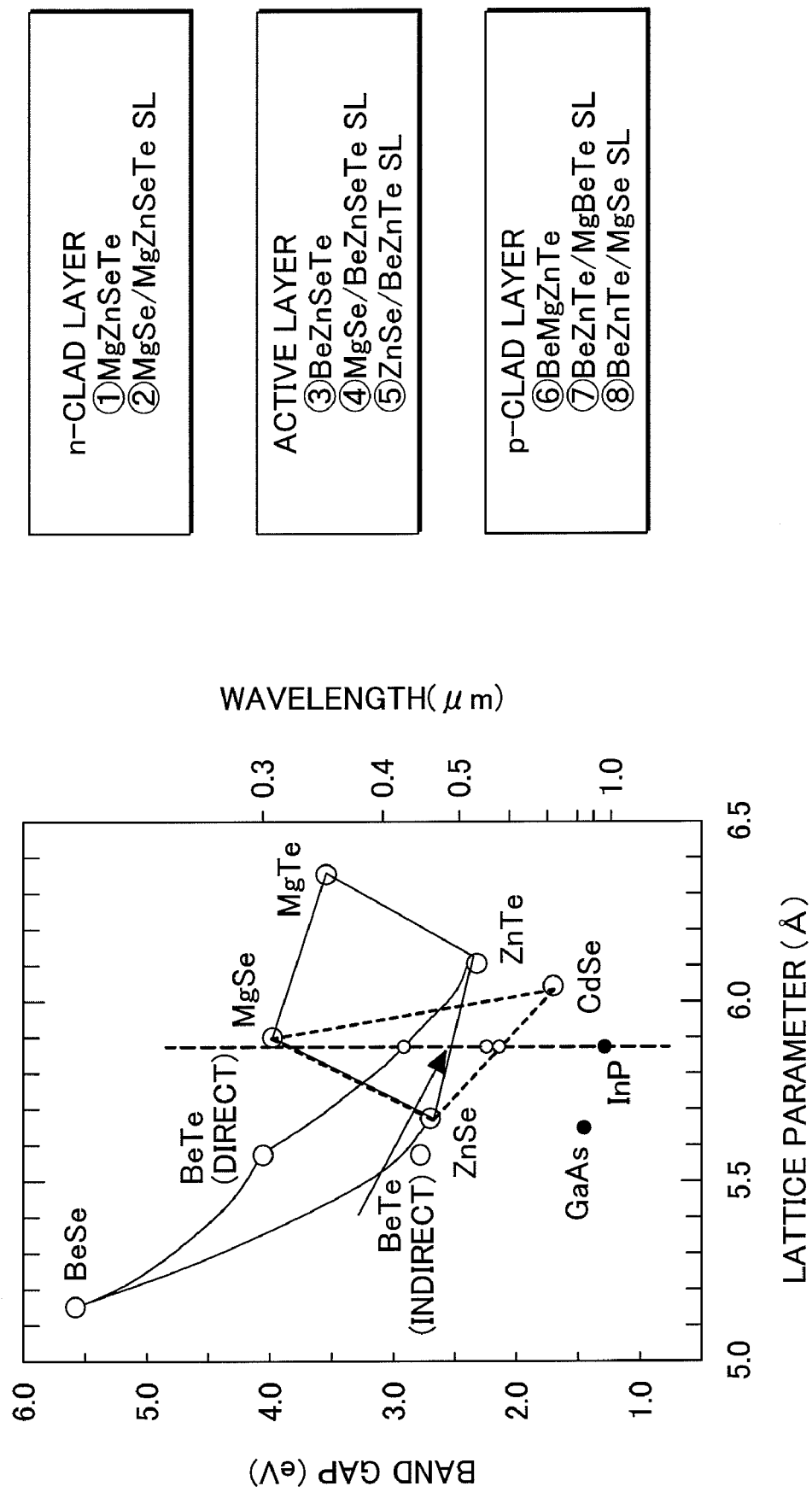
FIG. 1 shows a relation between lattice parameter and energy gap of Group II-VI compound semiconductors as related to the present invention.

A preferred embodiment of the present invention will now be described with reference to the accompanying drawings. In the following description, same drawing reference numerals are used for the same elements even in different drawings.

Particularly, the present invention provides the composition of a layer structure for a green semiconductor layer to be formed on an InP substrate, by utilizing a carefully selected material that satisfies the RoHS standard.

More particularly, the present invention provides a new n-cladding layer advantageous for a high concentration doping effect, an active layer suitable for the n-cladding laser according to the type of a band line-up, and a p-cladding material in relation to harmful material.

FIG. 1 illustrates a relation between lattice parameters and energy gaps of Group II-VI compound semiconductors as related to the invention. A dotted line running parallel to the vertical axis indicates a lattice parameter being lattice-matched to InP. Therefore, a laser diode is basically formed by using a semiconductor that exists on this line. In the present invention the allowance for lattice misfit was set to 1% or lower where the occurrence of crystal defects based on lattice misfit can sufficiently be suppressed by the application of a tension compensating laminate structure (to be described) and the like. A lattice parameter can be adjusted by controlling an amount of material to be supplied for crystal growth.

A description on the main concept or gist of the present invention from the viewpoint of lattice matching to InP will now be provided, in reference to drawings.

The following introduces two kinds of materials for an n-cladding layer provided by the present invention:

n-cladding #1: $Mg_xZn_{1-x}Se_yTe_{1-y}$ (0.5<y<1.0); and n-cladding #2: $Mg_xZn_{1-x}Se_yTe_{1-y}$/MgSe superlattice (0.5<y<1.0).

As one can see from FIG. 1, a material from #1 group can be lattice matched to InP. Also, MgSe from #2 group has a sufficiently low lattice misfit (i.e. 0.7%) with InP, which means that the occurrence of crystal defects based on lattice misfit was successfully suppressed.

The following introduces three kinds of materials for an active layer provided by the present invention:

Active layer #3: $Be_xZn_{1-x}Se_yTe_{1-y}$;

Active layer #4: $Be_xZn_{1-x}Se_yTe_{1-y}$/MgSe superlattice; and

Active layer #5: $Be_xZn_{1-x}Te$/ZnSe superlattice.

As one can see from FIG. 1, BeZnSeTe from #3 group can be lattice matched to InP. Moreover, as already mentioned about MgSe, #4 material group can roughly be lattice matched to InP. Meanwhile, ZnSe from #5 material group has 3.4% lattice misfit with InP, so it cannot be lattice matched to InP. However, this problem can be resolved by adjusting the composition of BeZnTe and by adjusting a thickness ratio of the opposite layer to match an average lattice parameter of the BeZnTe/ZnSe pair to InP. As a result, it becomes possible to reduce the stress caused by lattice mismatch.

The following introduces three kinds of materials for a p-cladding layer provided by the present invention:

p cladding #6: $Be_xMg_yZ_{1-x-y}Te$;

p cladding #7: $Be_xZn_{1-x}Te/Mg_yBe_{1-y}Te$; and p cladding #8: $Be_xZn_{1-x}Te$/MgSe superlattice.

As one can see from FIG. 1 and the description on MgSe above, all materials from groups #6, #7, and #8 can roughly be lattice matched to InP.

The present invention provides the n-cladding layers without Cd designated as one of harmful substances, the active layers that can be combined with the n-cladding layers, and the p-cladding layers. A combination of these elements leads to a low-impact green semiconductor laser.

A description on each of the material groups will now be provided below.

FIG. 2 illustrates lattice parameters (a) (unit: Å) and energy gaps (Eg) (unit: eV) of a major binary compound semiconductor as related to the present invention. The bowing parameter is used for calculation of an energy gap of mixed crystals (+).

The following explains in detail about the materials introduced above.

First, it is examined whether there is any material in the group n-cladding #1: $Mg_xZn_{1-x}Se_yTe_{1-y}$ (y>0.5), that can be lattice matched to an InP substrate.

$$A(x,y)=xya(MgSe)+x(1-y)a(MgTe)+(1-x)ya(ZnSe)+(1-x)(1-y)a(ZnTe)$$ Equation 1)

(0<x, y<1)

To set the lattice parameter A(x, y) of $Mg_xZn_{1-x}Se_yTe_{1-y}$ in Equation 1) to be matched to InP using a binary material lattice parameter (a), $$0.25x-0.43y-0.01xy+0.2313=0$$ Equation 2)

From the equation, we obtain
if x=0, y=0.538; and
if y=1, x=0.828.

Therefore, one can see that there exists $Mg_xZn_{1-x}Se_yTe_{1-y}$ being lattice matched to InP if y falls within a range of 0.5<y<1.

Next, it is examined whether there exists $Mg_xZn_{1-x}Se_yTe_{1-y}$ having energy gap (Eg) values of 2.8 eV, 2.9 eV, 3.0 eV, and 3.1 eV.

$$Eg=xyE(MgSe)+x(1-y)E(MgTe)+(1-x)yE(ZnSe)+(1-x)(1-y)E(ZnTe)+x(x-1)\{yB(MgSe-Te)+(1-y)B(Zn-Mg)\}+y(y-1)\{xB(ZnSe-Te)+(1-x)B(MgSe-Te)\}$$ Equation 3)

where 0<x, y<1.

Arranging the Equation 3) to obtain $$Eg=-1.271xy+0.98x-1.211y+0.26xx+1.621yy+1.361xxy+2.26$$ Equation 4)

The calculation result is shown in FIG. 3. The above condition is satisfied when y is between 0.5 and 1 (0.5<y<1). For instance, if Eg=3.0 eV, x=0.65 and y=0.90. Therefore, $Mg_{0.65}Zn_{0.35}Se_{0.90}Te_{0.10}$ is lattice matched to InP, and 3.0 eV as an energy gap (Eg) is sufficient for a cladding layer.

Although the calculation method used in the present invention is commonly used, it is more fully explained in J. Crystal Growth 214/215 (2000) 350 Kyurhee Shim et al. The above document also noted ZnMgSeTe and mentioned there exists a composition range that is lattice matched onto a ZnTe substrate, InAs substrate, and InP substrate. Then it reaches a conclusion saying that a quaternary mixed crystal of the spectrum range of cyan particularly on the ZnTe substrate.

Moreover, in Phys. stat. Sol. (a)192 No. 1, 206 Y. Ochiai et al. the inventors: Kishino, Nomura et al. used a superlattice structure of an MgSeTe layer and a ZnTe layer to change a film thickness thereof. They observed light emission at 2.37 eV and 2.47 eV and then utilized the MgSeTe layer as a carrier trapping layer of an LED on a ZnTe substrate.

Even though Phys. stat. Sol. (b)241 No. 3, 483 I. Nomura et al. does not specify carrier concentration, the inventors reported that an n-type Cl-doped MgZnSeTe layer may be used as a cladding layer of an LED on a ZnTe substrate. The quaternary mixed crystal at this time is $Mg_{0.4}Zn_{0.6}Se_{0.3}Te_{0.7}$. When this is compared with the quaternary mixed crystal on the InP substrate of the present invention, in the present invention the composition ratio of Mg and Se is increased, while the composition ratio of Zn and Te is decreased. Generally, Cl (chlorine), an n-type dopant, is very advantageous for the present invention because the n-type carrier concentration (doping efficiency) tends to increase with a smaller content of Te and a greater content of Se.

Further, the inventors filed a patent application related to a photoelectric properties on a ZnTe substrate (Japanese Patent Application Laid-Open No. 2003-258303, Kishino et al.).

As described earlier, the present invention teaches the formation of an independent n-cladding layer to provide an EL semiconductor device having the n-cladding layer, an active layer, and a p-cladding layer formed on an InP substrate.

The examination carried out on the n-cladding #1 is carried out again on the n-cladding #2 $Mg_xZn_{1-x}Se_yTe_{1-y}$/MgSe superlattice. Since MgSe is roughly lattice matched to InP, it is clear that the lattice matching conditions are satisfied. Moreover, the superlattice using MgZnSeTe that can be lattice matched to InP forms a type I band line-up with MgZnSeTe as a well layer. Thus, the energy level of a mini band formed in the superlattice is always higher than that of MgZnSeTe (lower valence band energy level and higher conduction band energy level) such that its band gap is substantially larger than that of MgZnSeTe. That is, it possesses a sufficient band gap as a cladding layer.

The following will now explain about an active layer.

Figure 4:
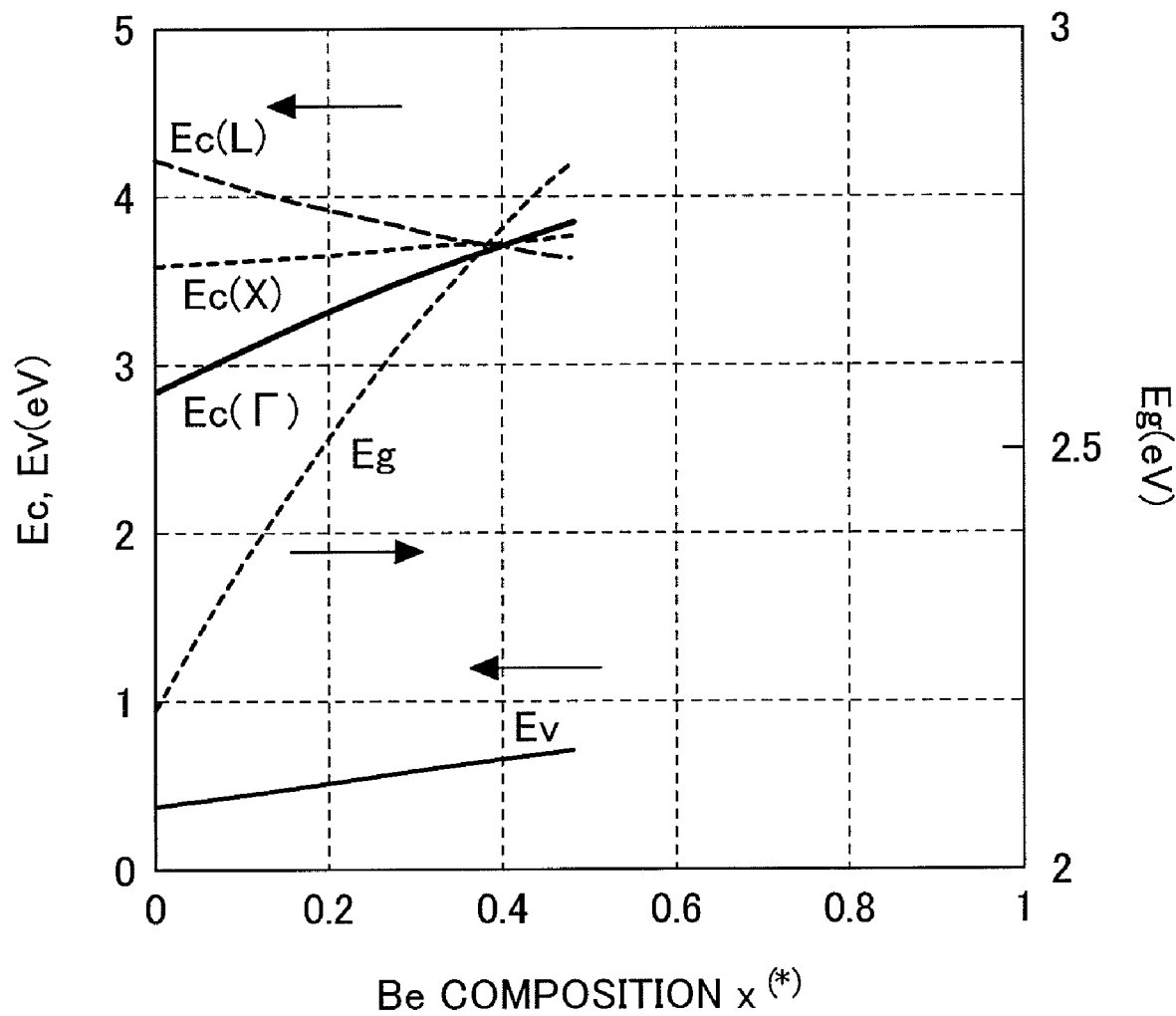
FIG. 4 shows BeZnSeTe lattice matched to an InP substrate calculated by a preferred embodiment of the present invention.

A description on an active layer #3 BeZnSeTe is provided first. FIG. 4 put the Be composition into the f(x) function with valence band and conduction band energy levels of $Be_xZn_{1-x}Se_yTe_{1-y}$ being lattice matched to InP as the left axis and the band gap (dotted line) as the right axis. Valence band energy levels are shown at a direct transition point Γ (solid line) as well as indirect transition points X and L (dashed line). The valence band of ZnSe was used as a reference energy level. As one can see from the graph, BeZnSeTe is lattice matched to InP when Be composition x is less than 0.48 (x<0.48) and a direct transition occurs when Be composition x is less than 0.4 (x<0.4). If x=0.13, the band gap Eg=2.3 eV. With this composition, a green laser can be manufactured. Besides, the addition of Be can increase bond strength of crystal, and improve the reliability of a semiconductor laser being prepared.

A description on an active layer #4 BeZnSeTe/MgSe is provided next. Because MgSe is roughly lattice matched to InP, it is evident that the lattice matching conditions are satisfied. Moreover, the superlattice using BeZnSeTe that can be lattice matched to InP forms a type I band line-up with BeZnSeTe as a well layer.

Therefore, BeZnSeTe/MgSe provides a high luminescence efficiency and may be suitable as an active layer of a semiconductor laser. Also, the energy level of a mini band can be adjusted by controlling the film thickness (or the thickness ratio to be more specific) of BeZnSeTe and MgSe. Further, the addition of Be can increase bond strength of crystal, and improve the reliability of a semiconductor laser being prepared.

A description on an active layer #5 $Be_xZn_{1-x}Te/ZnSe$ superlattice is provided next. Although ZnSe has a high lattice misfit (e.g., 3.4%) with InP, this problem can be resolved by making the Be composition ratio x in $Be_xZn_{1-x}Te$ smaller than that of InP lattice matching and by a relative thickness ratio between BeZnTe and ZnSe to match an average lattice parameter of the BeZnTe/ZnSe pair to InP.

The following will now explain about p-cladding.

Figure 5:
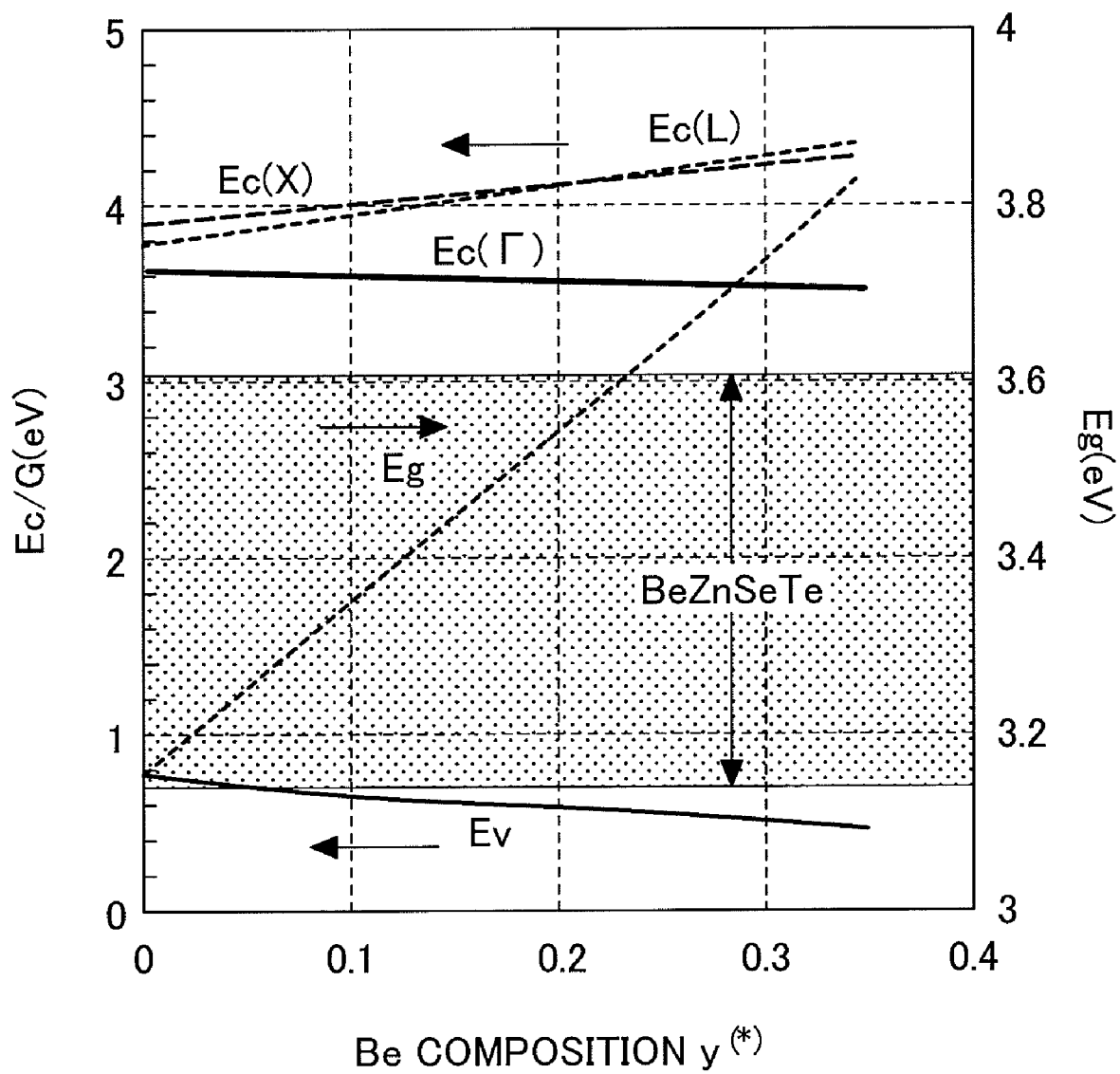
FIG. 5 shows BeMgZnTe lattice matched to an InP substrate calculated by a preferred embodiment of the present invention.

A description on p-cladding #6: $Be_xMg_yZn_{1-x-y}Te$ is provided first. FIG. 5 shows a relation between the Mg composition and valence band and conduction band energy levels of $Be_xMg_yZn_{1-x-y}Te$ being lattice matched to InP as the left axis and the band gap (dotted line) as the right axis. Valence band energy levels are shown at a direct transition point Γ (solid line) as well as indirect transition points X and L (dashed line). The valence band of ZnSe was used as a reference energy level. As one can see from the graph, BeMgZnTe is lattice matched to InP when Be composition y is less than 0.35 (y<0.35) and a direct transition occurs in the entire lattice matching range. The graph also shows valence band and conduction band energy levels of active layer material BeZnSeTe discussed previously at 2.3 eV which is an optimum energy gap of a green laser made out of BeZnSeTe. The type I band line-up is also possible for the BeZnSeTe active layer. Moreover, the Be composition x in $Be_xMg_yZn_{1-x-y}Te$ is greater than 0.1 (x>0.1), and valence band and conduction band discontinuous energy values for the BeZnSeTe active layer are ΔEv>0.1 eV and ΔEc>0.3 eV, respectively. With this combination, sufficient carriers may be confined in the active layer.

A description on p-cladding #7: $Be_xZn_{1-x}Te/Mg_yBe_{1-y}Te$ is provided next. As shown in FIG. 1, $Be_xZn_{1-x}Te$ is lattice matched to InP when x=0.48, and an energy gap thereof is 2.77 eV. $Mg_yBe_{1-y}Te$ is lattice matched to InP when y=0.64, and an energy gap thereof is about 3.7 eV. By adjusting a relative composition ratio between $Be_{0.48}Zn_{0.52}Te$ and $Mg_{0.64}Be_{0.36}Te$, sufficient carriers can be confined in the active layer.

A description on p-cladding #8: $Be_xZn_{1-x}Te/MgSe$ is provided next. As MgSe is roughly lattice matched to InP, it is evident that the lattice matching conditions are satisfied. That is, it possesses a sufficient band gap as a cladding layer.

In order to verify the above, crystals were prepared and evaluated in several ways as follows. In particular, MgZnSeTe, an n-cladding material, was prepared and evaluated.

Figure 6A:
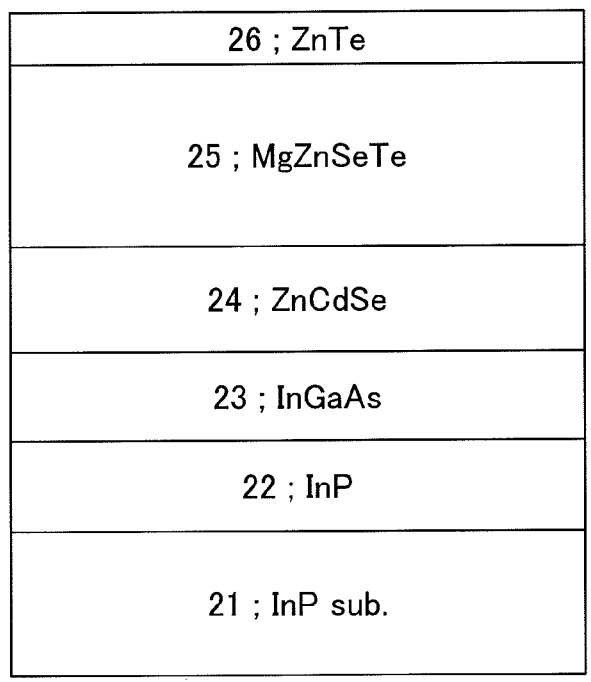
FIG. 6A shows the structure of an MgZnSeTe sample and FIG. 6B shows a photoluminescence spectrum thereof.

FIG. 6A shows the structure of an MgZnSeTe sample being prepared. To prepare the sample, an InP buffer layer 22, an InGaAs buffer layer 23, a ZnCdSe buffer layer 24, an MgZnSeTe layer 25, and a ZnTe cap layer 26 are formed on an InP substrate 21. Then the sample was grown using a Molecular Beam Epitaxy (MBE) system with two growth chambers. To this end, the InP substrate 21 goes through optimal surface treatment (or surface passivation) and is set in the MBE system. The sample is placed in a preparation chamber for sample exchange and vacuumed by a vacuum pump to $10^{-3}$ Pa or lower. The chamber was then heated to 100° C. to remove remaining moisture and impurity gas. Next, the sample is carried into an III-V compound growth chamber and the substrate is heated to 500° C. to remove an oxide thereon, while exposing the surface of the substrate to P molecular beam. When the substrate temperature is 450° C., the InP buffer layer 22 is grown to a thickness of 30 nm. Meanwhile, the InGaAs buffer layer 23 is grown to a thickness of 200 nm when the substrate temperature is 470° C. Later the sample is carried into an II-VI compound growth chamber to grow the ZnCdSe buffer layer 24 to a thickness of 200 nm. Then the undoped MgZnSeTe layer 25 according to the present invention (layer thickness=840 nm) and finally the ZnTe cap layer 26 (layer thickness=10 nm) were laminated sequentially.

Figure 6B:
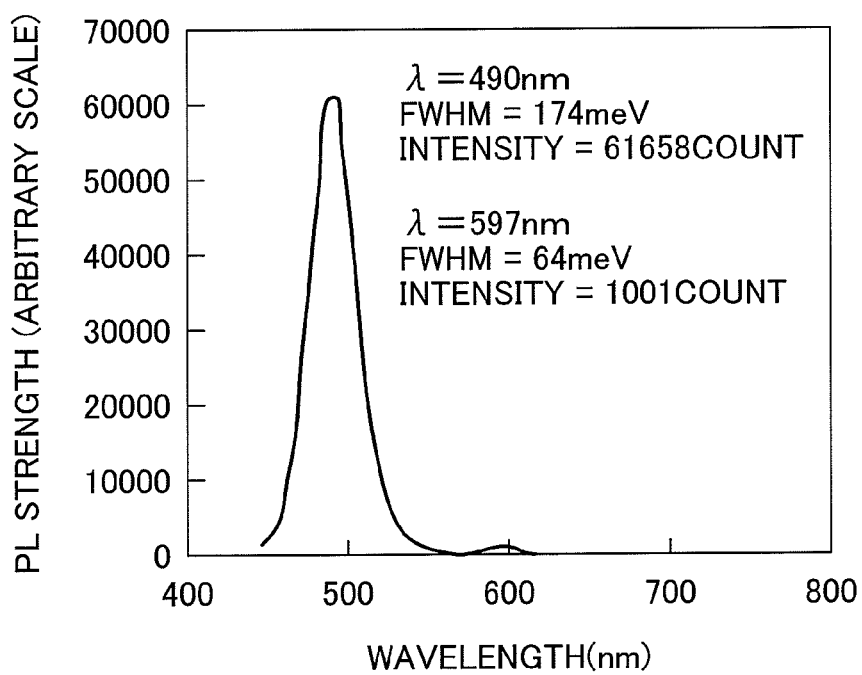

A band gap of the prepared MgZnSeTe was evaluated. FIG. 6B illustrates a photoluminescence (PL) spectrum of MgZnSeTe being measured at room temperature. For the measurement, a HeCd laser was used as an excitation light source. As can be seen from FIG. 6B, there are two peaks of different intensities. A peak at 490 nm with higher intensity is attributed to the luminescence of MgZnSeTe, and the other peak at 597 nm with lower intensity is attributed to the luminescence of ZnCdSe. Seeing that the luminescence intensity from MgZnSeTe is high, one may conclude that a good quality crystal was obtained under the manufacturing conditions set forth above.

Next, a reflection spectrum of the sample was measured to obtain a band gap of the sample. An interference corresponding to the film thickness of MgZnSeTe was observed in the reflection spectrum, and an absorption edge, i.e. band gap, of MgZnSeTe was predicted from a change in the intensity. A band gap (Eg(R)) predicted from the reflection spectrum was 2.99 eV. Meanwhile, the PL peak wavelength, Eg(PL), in FIG. 6B corresponds to 2.53 eV. The difference between the adsorption edge and the luminescence energy seems to be a Stokes shift that is often observed in II-VI materials including TeSe. Therefore, a band gap of the prepared sample is believed to be 2.99 eV. In order to check this, composition of the sample was obtained using an Electron Probe Micro Analyzer (EPMA) and X-ray diffraction measurement. It turned out the prepared sample has the composition of $Mg_{0.56}Zn_{0.44}Se_{0.85}Te_{0.15}$. The equation of the band gap composition-dependence described earlier was used to get a band gap corresponding to this composition, i.e. Eg=2.90 eV. These facts draw a conclusion that the MgZnSeTe mix-crystal has a sufficient band gap as a cladding layer for a green semiconductor laser and a good quality crystal is obtained.

Figures 7A, 7B:
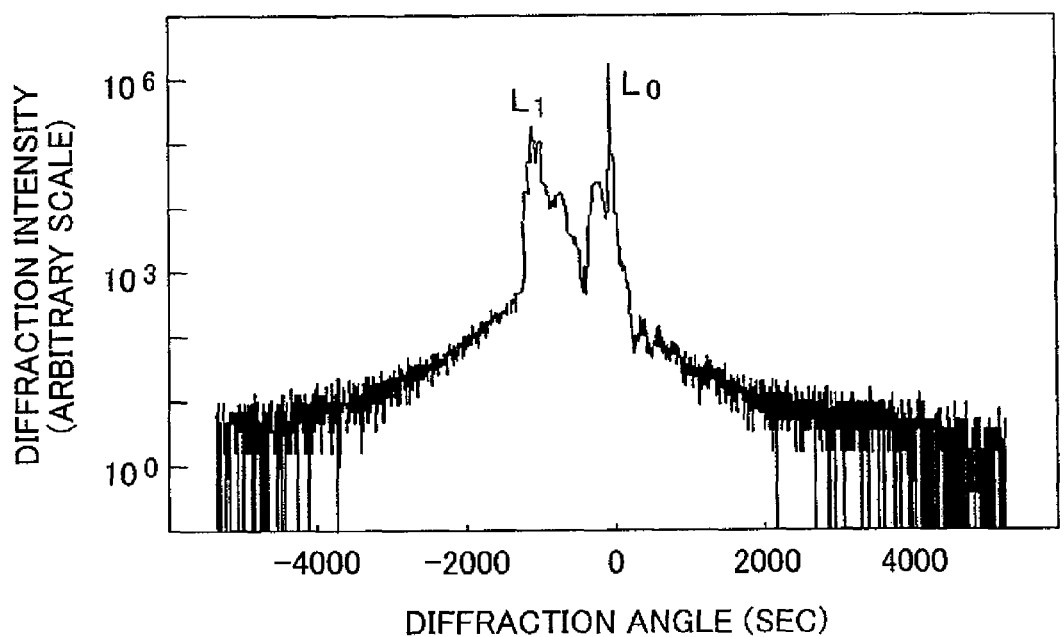
FIG. 7A shows the structure of an MgZnSeTe:Cl sample
FIG. 7B shows an X-ray diffraction spectrum thereof.

Requirements for an n-cladding material also include an n-type doping for low resistance, besides the band gap condition. FIG. 7A illustrates the laminate structure of a sample prepared for a doping evaluation. To prepare the sample, an InP buffer layer 32, an InGaAs buffer layer 33, a ZnCdSe buffer layer 34, an MgZnSeTe layer 35, and a ZnTe cap layer 36 are formed on an InP substrate 31. Then the sample was grown using a Molecular Beam Epitaxy (MBE) system with two growth chambers. To this end, the InP substrate 31 goes through optimal surface treatment (or surface passivation) and is set in the MBE system. The sample is placed in a preparation chamber for sample exchange and vacuumed by a vacuum pump to $10^{-3}$ Pa or lower. The chamber was then heated to 100° C. to remove remaining moisture and impurity gas.

Next, the sample is carried into an III-V compound growth chamber and the substrate is heated to 500° C. to remove an oxide thereon, while exposing the surface of the substrate to P molecular beam. When the substrate temperature is 450° C., the Si doped n-type InP buffer layer 32 is grown to a thickness of 30 nm. Meanwhile, the Si-doped InGaAs buffer layer 33 is grown to a thickness of 200 nm when the substrate temperature is 470° C. Later the sample is carried into an II-VI compound growth chamber to grow the Cl-doped ZnCdSe buffer layer 34 to a thickness of 200 nm. Then the Cl-doped n-type MgZnSeTe layer (e.g., $Mg_{0.65}Zn_{0.35}Se_{0.90}Te_{0.10}$) 35 according to the present invention (layer thickness=800 nm) and finally the ZnTe cap layer 36 (layer thickness=10 nm) were laminated sequentially. $ZnCl_2$ was used for Cl doping, and the temperature of a $ZnCl_2$ cell was set to 110° C.

FIG. 7B illustrates measurement results of lattice misfit of the sample, which are obtained with the help of a 4 crystal X-ray diffraction system. As shown, a peak of the epitaxial growth layer was observed in a minus side of a diffraction peak from an InP substrate being denoted as L0. A peak denoted as L1 was diffraction from MgZnSeTe, and its lattice misfit amounted to +0.8%. One can see that a good crystal was obtained because of a narrow Full Width at Half Maximum (FWHM) and a high diffraction intensity. Finally, a Schottky electrode was deposited on the sample, and carrier concentration of the sample was evaluated by measuring capacity and voltage.

Figure 8A:
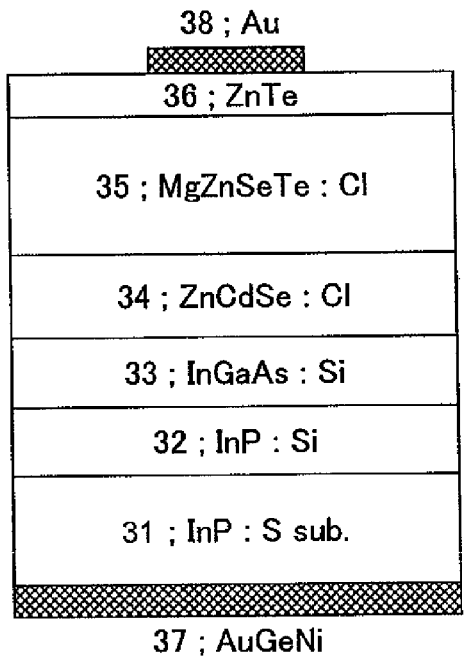
FIG. 8A shows the structure of an MgZnSeTe:Cl Schottky diode sample
Figure 8B:
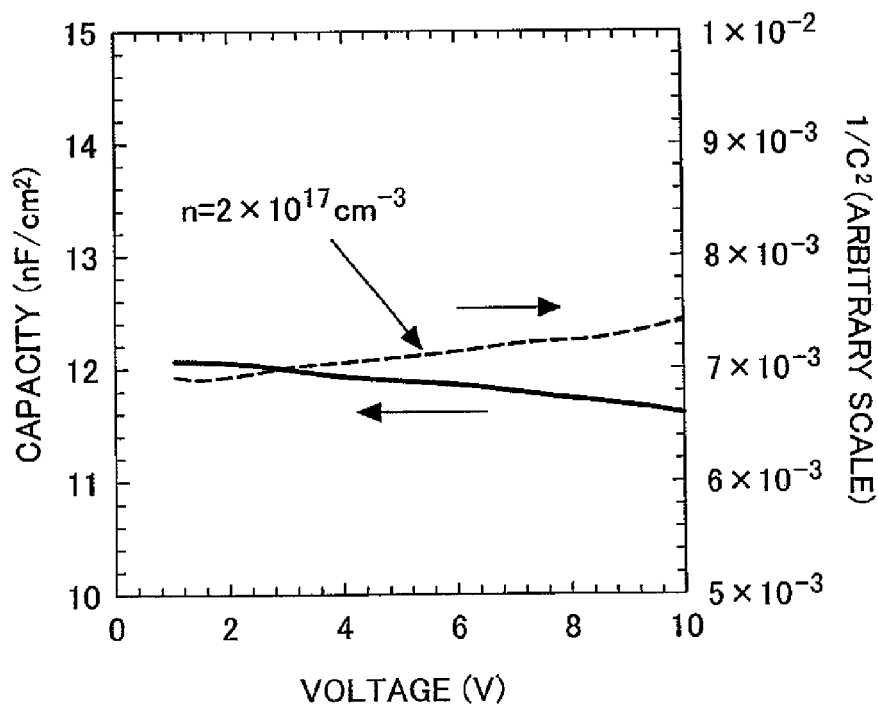
FIG. 8B shows capacity and voltage properties thereof.
Figure 13A:
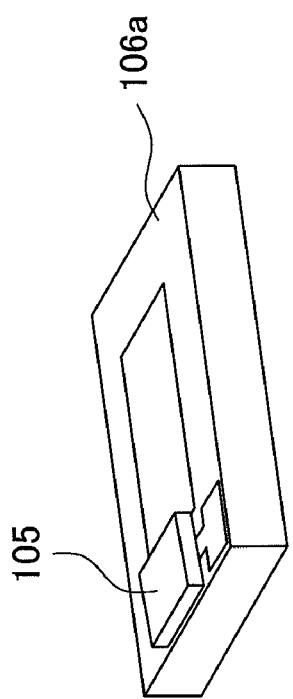
FIGS. 13A through 13D are diagrams explaining the second half portion of a conventional mechanism to form an individual EL semiconductor device.
Figure 13B:
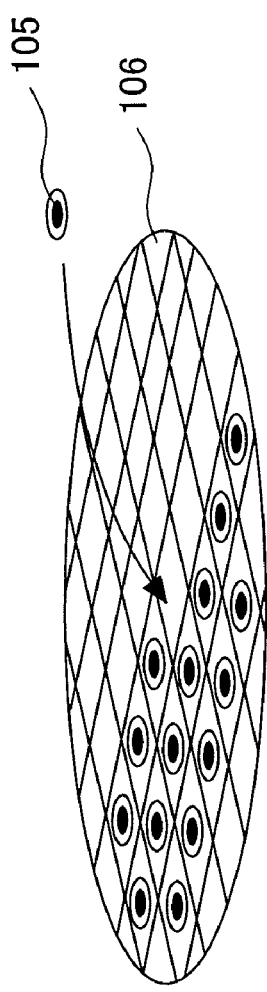
Figure 13C:
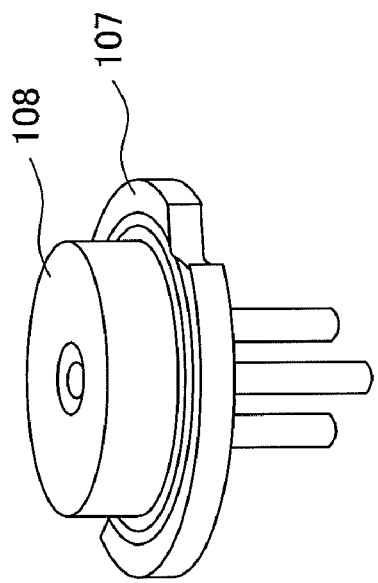
Figure 13D:
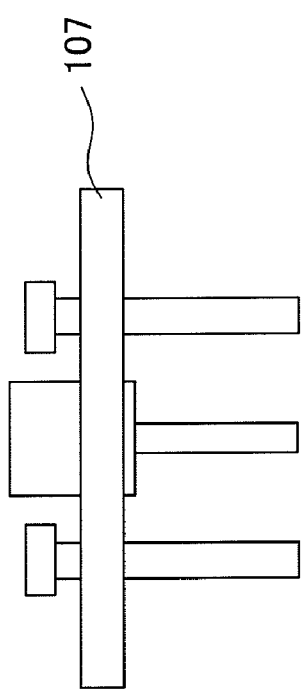

FIG. 8A illustrates the structure of a Schottky electrode. In detail, an Au Schottky electrode was formed on the surface of a crystal with the help of a resistive heating deposition system. An AuGeNi ohmic electrode was formed on the substrate side. FIG. 8B illustrates measurement results of capacity and voltage properties. It turned out that when a reverse bias is applied to the Schottky electrode, capacity is decreased and MgZnSeTe is doped into an n-type. The drawing also shows $1/C^2$. $1/C^2$ decreases almost linearly with respect to the bias, and the carrier concentration, n, in the MgZnSeTe layer was $2\times10^{17}$ cm$^{-3}$. The carrier concentration was increased to $2\times10^{18}$ cm$^{-3}$ when the $ZnCl_2$ cell temperature was raised to 130° C.

The examination results described above confirm that MgZnSeTe is favorable as an n-cladding layer for a green semiconductor laser.

Laminate structures of several II-VI group semiconductor lasers based on the present invention are explained next.

FIG. 9 illustrates an approximate cross-sectional view of one embodiment of the present invention. The sample is prepared by crystal growth in a Molecular Beam Epitaxy (MBE) system with two growth chambers. To this end, the InP substrate 31 goes through optimal surface treatment (or surface passivation) and is set in the MBE system. The sample is placed in a preparation chamber for sample exchange and vacuumed by a vacuum pump to $10^{-3}$ Pa or lower. The chamber was then heated to 100° C. to remove remaining moisture and impurity gas.

Next, the sample is carried into an III-V compound growth chamber and the substrate is heated to 500° C. to remove an oxide thereon, while exposing the surface of the substrate to P molecular beam. When the substrate temperature is 450° C., the Si doped n-type InP buffer layer 32 is grown to a thickness of 30 nm. Meanwhile, the Si-doped InGaAs buffer layer 33 is grown to a thickness of 200 nm when the substrate temperature is 470° C.

Later the sample is carried into an III-VI compound growth chamber to grow a cladding layer 40 (layer thickness=0.5 μm) made of a Cl-doped n-type MgZnSeTe layer (e.g., $Mg_{0.65}Zn_{0.35}Se_{0.90}Te_{0.10}$), a guide layer 42 (layer thickness=70 nm) made of a BeZnSeTe/MgSe superlattice structure, a BeZnSeTe quantum well active layer 43 (layer thickness=10 nm), and a guide layer 44 (layer thickness=70 nm) made of a BeZnSeTe/MgSe superlattice structure. Then a cladding layer 45 (layer thickness=0.6 μm) made of an N-doped p-type BeZnTe/MgSe superlattice structure, an N-doped p-type BeZnTe layer 46 (layer thickness=30 nm), an N-doped p-type BeZnTe/ZnTe superlattice contact layer 47 (total layer thickness=500 nm), and finally an N-doped p-type ZnTe cap layer 48 (layer thickness=30 nm) are laminated sequentially.

FIG. 10 illustrates an approximate cross-sectional view of another embodiment of the present invention. The sample is prepared by crystal growth in a Molecular Beam Epitaxy (MBE) system with two growth chambers. To this end, the InP substrate 31 goes through optimal surface treatment (or surface passivation) and is set in the MBE system. The sample is placed in a preparation chamber for sample exchange and vacuumed by a vacuum pump to $10^{-3}$ Pa or lower. The chamber was then heated to 100° C. to remove remaining moisture and impurity gas.

Next, the sample is carried into an III-V compound growth chamber and the substrate is heated to 500° C. to remove an oxide thereon, while exposing the surface of the substrate to P molecular beam. When the substrate temperature is 450° C., the Si doped n-type InP buffer layer 32 is grown to a thickness of 30 nm. Meanwhile, the Si-doped InGaAs buffer layer 33 is grown to a thickness of 200 nm when the substrate temperature is 470° C.

Later the sample is carried into an III-VI compound growth chamber to grow a cladding layer 50 (layer thickness=0.5 μm) made of a Cl-doped n-type $Mg_{0.65}Zn_{0.35}Se_{0.90}Te_{0.10}$/MgSe superlattice structure, a graded layer 51 (layer thickness=0.5 μm) made of a Cl-doped n-type $Mg_{0.65}Zn_{0.35}Se_{0.90}Te_{0.10}$/MgSe superlattice structure, a guide layer 52 (layer thickness=70 nm) made of a BeZnSeTe/MgSe superlattice structure, a BeZnSeTe quantum well active layer 53 (layer thickness=10 nm), and a guide layer 54 (layer thickness=70 nm) made of a BeZnSeTe/MgSe superlattice structure. Then a cladding layer 55 (layer thickness=0.6 μm) made of an N-doped p-type BeZnTe/MgSe superlattice structure, an N-doped p-type BeZnTe layer 56 (layer thickness=30 nm), an N-doped p-type BeZnTe/ZnTe superlattice contact layer 57 (total layer thickness=500 nm), and finally an N-doped p-type ZnTe cap layer 58 (layer thickness=30 nm) are laminated sequentially.

Here, the n-type cladding superlattice is constituted by MgSe:2 molecular layer (2ML) and MgZnSeTe:4ML, and the graded layer superlattice is constituted by 10 pairs of MgSe: 2ML/MgZnSeTe:3ML, 10 pairs of MgSe:2ML/MgZnSeTe: 2ML, and 10 pairs of MgSe:2ML/MgZnSeTe:1ML.

FIG. 11 illustrates an approximate cross-sectional view of still another embodiment of the present invention. The sample is prepared by crystal growth in a Molecular Beam Epitaxy (MBE) system with two growth chambers. To this end, the InP substrate 31 goes through optimal surface treatment (or surface passivation) and is set in the MBE system. The sample is placed in a preparation chamber for sample exchange and vacuumed by a vacuum pump to $10^{-3}$ Pa or lower. The chamber was then heated to 100° C. to remove remaining moisture and impurity gas.

Next, the sample is carried into an III-V compound growth chamber and the substrate is heated to 500° C. to remove an oxide thereon, while exposing the surface of the substrate to P molecular beam. When the substrate temperature is 450° C., the Si doped n-type InP buffer layer 32 is grown to a thickness of 30 nm. Meanwhile, the Si-doped InGaAs buffer layer 33 is grown to a thickness of 200 nm when the substrate temperature is 470° C.

Later the sample is carried into an II-VI compound growth chamber to grow a cladding layer 60 (layer thickness=0.5 μm) made of a Cl-doped n-type $Mg_{0.65}Zn_{0.35}Se_{0.90}Te_{0.10}$/MgSe superlattice structure, a graded layer 61 (layer thickness=0.5 μm) made of a Cl-doped n-type $Mg_{0.65}Zn_{0.35}Se_{0.90}Te_{0.10}$/MgSe superlattice structure, a guide layer 62 (layer thickness=70 nm) made of a BeZnSeTe/MgSe superlattice structure, a BeZnSeTe/MgSe multiple quantum well active layer 63 (layer thickness=10 nm), and a guide layer 64 (layer thickness=70 nm) made of a BeZnSeTe/MgSe superlattice structure. Then an N-doped p-type BeMgZnTe cladding layer 65 (layer thickness=0.6 μm), an N-doped p-type BeZnTe layer 66 (layer thickness=30 nm), an N-doped p-type BeZnTe/ZnTe superlattice contact layer 67 (total layer thickness=500 nm), and finally an N-doped p-type ZnTe cap layer 68 (layer thickness=30 nm) are laminated sequentially.

Here, the n-type cladding superlattice is constituted by MgSe:2 molecular layer (2ML) and MgZnSeTe:4ML, and the graded layer superlattice is constituted by 10 pairs of MgSe:2ML/MgZnSeTe:3ML, 10 pairs of MgSe:2ML/MgZnSeTe:2ML, and 10 pairs of MgSe:2ML/MgZnSeTe:1ML.

The following description will be provided in reference to FIGS. 12 and 13. First of all, a p-type ZnTe contact layer 48, 58, 68 bearing a predetermined shape of photo-resist pattern (not shown) by lithography is formed on an epitaxial wafer prepared by the method illustrated in FIG. 9, 10 or 11. After the surface except for a stripe portion is covered by insulator film, a Pd film, a Pt film, and an Au film for example are sequentially vacuum deposited onto the entire face. In this manner, a p-type electrode made of Pd/Pt/Au is formed on the ZnTe contact layer 48, 58, 68. If necessary, thermal treatment is carried out to cause an ohmic contact. Meanwhile, an n-type InP substrate is made as thin as approximately 100 μm, and an n-type electrode made of Au/Ge for example is deposited thereon, creating an ohmic contact.

Next, as illustrated in FIGS. 12(c)-(e), an end portion of the wafer is cracked with a diamond cutter, and pressure is applied thereto to open the crack, tearing it apart or cleaving. Later, about 5% low reflection coating and about 95% high reflection coating are deposited or sputtered by using $Al_2O_3$, $SiO_x$, or $SiN_x$ onto a front and back luminescent sectional face, respectively. Then a pellet dicing process is carried out to initiate a cleavage by scribe marks in a stripe direction, thereby dicing the wafer into chips.

To continue the description in reference to FIG. 13, the chip being thusly obtained is arranged on an Si sub mount by properly placing it at the position of a luminescence point and matching to an angle of the sectional face. Solder is applied between the Si sub mount and the chip and heated such that the Si wafer may be solidified by an alloy process using a molten solder. Next, the Si wafer is cut with a dicer and separated into individual chips. Later a die-bonding process for bonding the chips onto a heat sink stem made of copper for example is carried out, followed by a heating process to fix them thereon with the application of an adhesive or solder.

Next, a wire bonding process for connecting an electrode on the chip with a terminal on the stem is carried out. Then a wind cap serving as a laser beam outlet is welded onto the stem and sealed air tightly together to complete a final package.

While the invention has been shown and described with reference to certain preferred embodiments thereof, it will be understood by those skilled in the art that various changes in form and details may be made therein without departing from the spirit and scope of the invention as defined by the appended claims. For instance, values, structures, substrates, materials, processes, etc. discussed in the embodiments of the invention are for illustrative purposes only, so other values, structures, substrates, materials, processes, etc. may be employed if necessary.

To be more specific, while the advantageous embodiment of the present invention used $Mg_xZn_{1-x}Se_yTe_{1-y}$ as a material for the n-type cladding layer, the cladding layer may have a superlattice structure formed of an MgZnSe layer, a BeSe layer, and a ZnTe layer.

What is claimed is:

1. An EL semiconductor device comprising:
   an InP substrate having at least n-type cladding layer, active layer, and p-type cladding layer formed thereon, wherein
   (i) the n-type cladding layer is a single layer film of which a composition ratio of $Mg_xZN_{1-x}Se_yTe_{1-y}$ in the n-type cladding layer is above 80% and below 100%, and a composition ratio of Se in the $Mg_xZn_{1-x}Se_yTe_{1-y}$, y, is above 0.5; or
   (ii) the n-type cladding layer is formed of a laminate film containing $Mg_xZn_{1-x}Se_yTe_{1-y}$, in which the laminate film has at least a pair of two layers composed of a first layer with a composition ratio of $Mg_xZn_{1-x}Se_yTe_{1-y}$ being above 80% and below 100% and a composition ratio of Se in $Mg_xZn_{1-x}Se_yTe_{1-y}$, y, being above 0.5 and of a second layer with a composition ratio of MgSe being above 80% and below 100%, and the pair of the laminate film is superposed and piled up repeatedly a plural number of times, and
   wherein
   (iii) the active layer is a single layer film of which a composition ratio of BeZnSeTe in the active layer is above 80% and below 100%, and a lattice parameter ($a_a$) of the BeZnSeTe and a lattice parameter ($a_{InP}$) of the InP substrate satisfy a condition of $-0.01<(a_a-a_{InP})/a_{InP}<0.01$; or
   (iv) the active layer includes at least a first layer and a second layer, in which a composition ratio of BeZnSeTe in the first layer is above 80% and below 100%, a lattice parameter ($a_a$) of the BeZnSeTe and a lattice parameter (aInP) of the InP substrate satisfy a condition of $-0.01<(a_a-a_{InP})/a_{InP}<0.01$, and a composition ratio of MgSe in the second layer is above 80% and below 100%, and in which a pair of a laminate film including at least two layers composed of the first layer and the second layer is superposed and piled up repeatedly a plural number of times; or
   (v) the active layer includes at least a first layer and a second layer, in which a composition ratio of BeZnTe in the first layer is above 80% and below 100%, a lattice parameter ($a_a$) of the BeZnTe, and a composition ratio of ZnSe in the second layer is above 80% and below 100%, and in which a pair of a laminate film including at least two layers composed of the first layer and the second layer is superposed and piled up repeatedly a plural number of times.

2. The EL semiconductor device comprising:
an InP substrate having at least n-type cladding layer, active layer, and p-type cladding layer formed thereon, wherein
  (i) the n-type cladding layer is a single layer film of which a composition ratio of $Mg_xZn_{1-x}Se_yTe_{1-y}$ in the n-type cladding layer is above 80% and below 100%, and a composition ratio of Se in the $Mg_xZn_{1-x}Se_yTe_{1-y}$, y, is above 0.5; or
  (ii) the n-type cladding layer is formed of a laminate film containing $Mg_xZn_{1-x}Se_yTe_{1-y}$, in which the laminate film has at least a pair of two layers composed of a first layer with a composition ratio of $Mg_xZn_{1-x}Se_yTe_{1-y}$ being above 80% and below 100% and a composition ratio of Se in $Mg_xZn_{1-x}Se_yTe_{1-y}$, y, being above 0.5 and of a second layer with a composition ratio of MgSe being above 80% and below 100%, and the pair of the laminate film is superposed and piled up repeatedly a plural number of times, and
wherein
  (iii) the p-type cladding layer is a single layer film of which a composition ratio of BeMgZnTe in the p-type cladding is above 80% and below 100%, and a lattice parameter $(a_p)$ of the BeMgZnTe and a lattice parameter $(a_{InP})$ of the InP substrate satisfy a condition of $-0.01<(a_p-a_{InP})/a_{InP}<0.01$; or
  (iv) the p-type cladding layer includes at least a first layer and a second layer, in which a composition ratio of BeZnTe in the first layer is above 80% and below 100%, a lattice parameter $(a_p)$ of the BeZnTe and a lattice parameter $(a_{InP})$ of the InP substrate satisfy a condition of $-0.01<(a_p-a_{InP})/a_{InP}<0.01$, a composition ratio of MgBeTe in the second layer is above 80% and below 100%, and a lattice parameter $(a_p)$ of the MgBeTe and a lattice parameter $(a_{InP})$ of the InP substrate satisfy a condition of $-0.01<(a_p-a_{InP})/a_{InP}<0.01$, and in which a pair of a laminate film including at least two layers composed of the first layer and the second layer is superposed and piled up repeatedly a plural number of times; or
  (v) the p-type cladding layer includes at least a first layer and a second layer, in which a composition ratio of BeZnTe in the first layer is above 80% and below 100%, a lattice parameter $(a_p)$ of the BeZnTe and a lattice parameter $(a_{InP})$ of the InP substrate satisfy a condition of $-0.01<(a_p-a_{InP})/a_{InP}<0.01$, and a composition ratio of MgSe in the second layer is above 80% and below 100%, and in which a pair of a laminate film including at least two layers composed of the first layer and the second layer is superposed and piled up repeatedly a plural number of times.

3. The EL semiconductor device comprising:
an InP substrate having at least n-type cladding layer, active layer, and p-type cladding layer formed thereon, wherein
  (i) the n-type cladding layer is a single layer film of which a composition ratio of $Mg_xZn_{1-x}Se_yTe_{1-y}$, in the n-type cladding layer is above 80% and below 100%, and a composition ratio of Se in the $Mg_xZn_{1-x}Se_yTe_{1-y}$, y, is above 0.5; or
  (ii) the n-type cladding layer is formed of a laminate film containing $Mg_xZn_{1-x}Se_yTe_{1-y}$, in which the laminate film has at least a pair of two layers composed of a first layer with a composition ratio of $Mg_xZn_{1-x}Se_yTe_{1-y}$ being above 80% and below 100% and a composition ratio of Se in $Mg_xZn_{1-x}Se_yTe_{1-y}$, y, being above 0.5 and of a second layer with a composition ratio of MgSe being above 80% and below 100%, and the pair of the laminate film is superposed and piled up repeatedly a plural number of times,
wherein
  (iii) the active layer is a single layer film of which a composition ratio of BeZnSeTe in the active layer is above 80% and below 100%, and a lattice parameter $(a_a)$ of the BeZnSeTe and a lattice parameter $(a_{InP})$ of the InP substrate satisfy a condition of $-0.01<(a_a-a_{InP})/a_{InP}<0.01$; or
  (iv) the active layer includes at least a first layer and a second layer, in which a composition ratio of BeZnSeTe in the first layer is above 80% and below 100%, a lattice parameter $(a_a)$ of the BeZnSeTe and a lattice parameter $(a_{InP})$ of the InP substrate satisfy a condition of $-0.01<(a_a-a_{InP})/a_{InP}<0.01$, and a composition ratio of MgSe in the second layer is above 80% and below 100%, and in which a pair of a laminate film including at least two layers composed of the first layer and the second layer is superposed and piled up repeatedly in a plural number of times; or
  (v) the active layer includes at least a first layer and a second layer, in which a composition ratio of BeZnTe in the first layer is above 80% and below 100%, a lattice parameter $(a_a)$ of the BeZnTe, and a composition ratio of ZnSe in the second layer is above 80% and below 100%, and in which a pair of a laminate film including at least two layers composed of the first layer and the second layer is superposed and piled up repeatedly in a plural number of times, and
wherein
  (vi) the p-type cladding layer is a single layer film of which a composition ratio of BeMgZnTe in the p-type cladding is above 80% and below 100%, and a lattice parameter $(a_p)$ of the BeMgZnTe and a lattice parameter $(a_{InP})$ of the InP substrate satisfy a condition of $-0.01<(a_p-a_{InP})/a_{InP}<0.01$; or
  (vii) the p-type cladding layer includes at least a first layer and a second layer, in which a composition ratio of BeZnTe in the first layer is above 80% and below 100%, a lattice parameter $(a_p)$ of the BeZnTe and a lattice parameter $(a_{InP})$ of the InP substrate satisfy a condition of $-0.01<(a_p-a_{InP})/a_{InP}<0.01$, a composition ratio of MgBeTe in the second layer is above 80% and below 100%, and a lattice parameter $(a_p)$ of the MgBeTe and a lattice parameter $(a_{InP})$ of the InP substrate satisfy a condition of $-0.01<(a_p-a_{InP})/a_{InP}<0.01$, and in which a pair of a laminate film including at least two layers composed of the first layer and the second layer is superposed and piled up repeatedly a plural number of times; or
  (viii) the p-type cladding layer includes at least a first layer and a second layer, in which a composition ratio of BeZnTe in the first layer is above 80% and below 100%, a lattice parameter $(a_p)$ of the BeZnTe and a lattice parameter $(a_{InP})$ of the InP substrate satisfy a condition of $-0.01<(a_p-a_{InP})/a_{InP}<0.01$, and a composition ratio of MgSe in the second layer is above 80% and below 100%, and in which a pair of a laminate film including at least two layers composed of the first layer and the second layer is superposed and piled up repeatedly a plural number of times.

* * * * *